(12) United States Patent
Dahan

(10) Patent No.: US 8,867,684 B2
(45) Date of Patent: Oct. 21, 2014

(54) LOW LATENCY SYNCHRONIZER CIRCUIT

(71) Applicant: Dialog Semiconductor GmbH, Kirchheim/Teck-Nabem (DE)

(72) Inventor: Nir Dahan, Puchheim (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 14/018,556

(22) Filed: Sep. 5, 2013

(65) Prior Publication Data

US 2014/0205047 A1 Jul. 24, 2014

(30) Foreign Application Priority Data

Jan. 21, 2013 (EP) ..................................... 13152023

(51) Int. Cl.
*H03D 3/24* (2006.01)
*H04L 7/033* (2006.01)
(52) U.S. Cl.
CPC ....................................... *H04L 7/033* (2013.01)
USPC ........... 375/373; 375/294; 375/362; 375/366; 375/367; 327/141; 327/144; 327/147; 327/156; 327/163; 327/233; 327/235
(58) Field of Classification Search
USPC ......... 327/141, 144, 147, 156, 163, 233, 235; 375/294, 362, 366, 367, 373
See application file for complete search history.

(56) References Cited

U.S. PATENT DOCUMENTS

| | | | |
|---|---|---|---|
| 6,924,682 B1 | 8/2005 | Smith | |
| 8,060,771 B2 | 11/2011 | Tyrrell | |
| 8,334,712 B2* | 12/2012 | Klein et al. | .................... 327/141 |
| 2003/0001612 A1* | 1/2003 | Menezes et al. | ................. 326/37 |
| 2009/0153202 A1 | 6/2009 | Yagi | |
| 2011/0215852 A1 | 9/2011 | Klein et al. | |

FOREIGN PATENT DOCUMENTS

EP 2139113 12/2009

OTHER PUBLICATIONS

European Search Report 13152023.1-1810, Mailed: Jun. 25, 2013.

* cited by examiner

*Primary Examiner* — Rahel Guarino
(74) *Attorney, Agent, or Firm* — Saile Ackerman LLC; Stephen B. Ackerman

(57) ABSTRACT

An apparatus for synchronizing an incoming signal with a clock signal comprises two or more synchronizer circuits, wherein each synchronizer circuit receives the incoming signal and the clock signal. Each synchronizer circuit generates a synchronized signal, wherein the state of each synchronized signal changes on a different phase of said clock signal in response to a change of the state of said incoming signal. A decision mechanism circuit receives the synchronized signals generated by each synchronizer circuit, wherein the decision mechanism circuit determines the output signal in response to the change of the state of the incoming signal. The decision mechanism circuit further comprises a memory element having a state which is set according to a previously detected state of said signal, wherein the output signal is determined according to the state of the memory element.

20 Claims, 5 Drawing Sheets

LOW LATENCY SYNCHRONIZER CIRCUIT

TECHNICAL FIELD

The present document relates to synchronization of asynchronous signals. In particular, the present document relates to a circuit arrangement which comprises two or more synchronizer circuits working in parallel on different phases of a clock signal.

BACKGROUND

Synchronization schemes based on two flip-flops are well-known in art. Therein, two flip-flops are connected in series and are driven by a common clock signal.

The introduction of the second flip-flop aims to block a potential "metastable" condition of the first flip-flop. A "metastable" condition of a flip-flop may be caused by the asynchronous incoming signal changing its state exactly when the clock signal is changing. This condition leads to an unknown and unwanted situation in the output of the flip-flop. The standard technique is to introduce an extra flip-flop in order to block the "metastable" signal until the very next clock edge.

In some applications, mainly in the area of medical, automotive and space, a third flip-flop is used in the series behind the second flip-flop in order to increase the safety margin.

The above techniques are considered standard and safe. However, they introduce an inherent delay which is determined by the period of the clock signal which drives the flip-flops.

The present document addresses the above mentioned shortcomings of the standard synchronizer circuits. In particular, the present document describes synchronizer circuits which improve the inherent latency and/or improve the safety of synchronizer circuits without compromising the latency.

SUMMARY

A principal object of the present disclosure is to achieve stabile synchronization of asynchronous signals with low latency.

A further object of the present disclosure is to synchronize incoming signal with a clock signal.

A further object of the present disclosure is detecting reliably incoming signals for any possible timing of the incoming signal, wherein there will be at least one synchronizer circuit ready to record a change of state in the incoming signal within a fraction of a clock cycle.

According to an aspect, an apparatus for synchronizing an incoming signal with a clock signal is described. The incoming signal is typically a digital signal which has a low and a high state, which respectively correspond to logical states 0 and 1. An apparatus for synchronizing an incoming signal with a clock signal according to an embodiment may comprise two or more synchronizer circuits, wherein each synchronizer circuit receives the incoming signal and the clock signal. Each synchronizer circuit generates a synchronized signal. The state of each synchronized signal respectively changes on a different point in time of the clock signal in response to a change of the state of the incoming signal. Therein, a point in time of the clock signal may constitute a specific phase of the clock signal, such as e.g. an edge of the clock signal or any point defined e.g. by a predetermined delay after an edge of the clock signal. Thus, incoming signals can be reliably detected, as, for any possible timing of an incoming signal, there will be at least one synchronizer circuit that is ready to record a change of state in the incoming signal within a fraction of a clock cycle. Further, a decision mechanism circuit may be provided which receives the synchronized signals generated by each synchronizer circuit. The decision mechanism circuit determines an output signal of the synchronizing apparatus in response to the change of state of the incoming signal. Thus, the synchronized signals from the plurality of synchronizer circuits can be resolved into a single output signal by the decision mechanism circuit. A memory element may be provided, wherein the memory element has a state which is set according to a previously detected state of the incoming signal. The output signal is selected according to the state of the memory element. The memory element maintains a record of the state that is expected as a next input, such that information about the previous state of the incoming signal can be used in order to improve the detection speed and accuracy of the respective next change of state of the incoming signal.

According to embodiments, the decision mechanism circuit may determine a change of the state of the output signal of the synchronizing apparatus when the state of one of the received synchronized signals changes in response to the change of the state of the incoming signal and when the changed state of one of the received synchronized signals corresponds to the state of the memory element. This allows a particularly fast detection of the change of state, as the first synchronized signal which registers the change of state of the incoming signal is used for changing the state of the output signal.

According to embodiments, the decision mechanism circuit may determine a change of the state of the output signal of the synchronizing apparatus when the state of all the received synchronized signals change to the same state in response to the change of the state of the incoming signal and when the changed states of the received synchronized signals correspond to the state of the memory element. This ensures a highly reliable and robust detection of any changes of state, as a change of state is only output after it has been registered by all of the synchronizer circuits.

According to embodiments, the clock signal may comprise multiple phases and a plurality of synchronizer circuits may be provided. Each synchronizer circuit may be associated with a dedicated phase of the clock signal such that the state of its synchronized signal changes on the associated phase of the clock signal in response to a change of the state of the incoming signal. Thus, the low latency synchronization scheme as described above can be extended to multiple phases and the latency time between a change of state of the incoming signal and the corresponding change of state of the output synchronized signal can be reduced even further.

According to embodiments, each synchronizer circuit may comprise a first flip-flop which receives the clock signal and the incoming signal, wherein the first flip-flop generates a first latched signal. The state of the first latched signal changes on a predetermined first phase of the clock signal in response to the change of the state of the incoming signal. In other words, when the incoming signal changes its state, the first latched signal respectively changes its state on the predetermined first phase of the clock signal. Each synchronizer circuit may further comprise a second flip-flop which receives the clock signal and the latched signal of the first flip-flop, wherein the second flip-flop generates the synchronized signal of the synchronizer circuit. The state of the synchronized signal changes on a predetermined second phase of the clock signal in response to a change of the state of the first latched signal. Thus, each synchronizer circuit constitutes a two-stage configuration which avoids the output of a meta stable state of the first flip-flop to a state machine. Instead of or in addition to flip-flops, any suitable generic memory element may be used as an element of the synchronization stage.

Therein, the predetermined first phase of one synchronizer circuit may differ from a predetermined first phase of another synchronizer circuit. For example, each synchronizer circuit may be activated during a different phase of the clock signal, such that a change of state of the input signal will be detected quickly by at least one synchronizer circuit with an associated first clock phase that occurs just after the change of state of the input signal.

According to embodiments, the first and second phases of the clock signal may be subsequent phases of the clock signal, in particular a rising edge and a falling edge of the clock signal or a falling edge and a rising edge of the clock signal. Thus, the latched signal of the first flip-flop is passed through the second flip-flop and output as a synchronized signal of the synchronizer circuit during the subsequent clock phase after the change of state of the incoming signal has been detected by the first flip-flop. This reduces the latency of the synchronizing apparatus.

According to embodiments, two synchronizer circuits may be provided, wherein the first and the second phases of the clock signal for each synchronizer circuit have a phase difference of 180 degrees relative to each other. A first flip-flop of the first synchronizer circuit and a second flip-flop of the second synchronizer circuit may respectively be associated with identical clock phases. Thus, a basic circuit design option is provided, wherein e.g. the first flip-flop of the first synchronizer circuit is activated during a rising flank of the clock signal and the first flip-flop of the second synchronizer circuit is activated during a falling flank of the clock signal. A change of state of the incoming signal is thus detected within a maximum of half a clock cycle by either the first or the second synchronizer circuit, and is output by the synchronizer circuit after another half clock cycle.

According to embodiments, four synchronizer circuits may be provided, wherein the first and the second phases of the clock signal for each synchronizer circuit have a phase difference of 90 degrees relative to each other. The clock phase associated with the first flip-flop of one synchronizer circuit may have a phase difference of 90 degrees to the clock phase associated with the first flip-flop of another synchronizer circuit. A change of state of the incoming signal is thus detected within a maximum of a quarter clock cycle by one of the synchronizer circuits, and is output by the synchronizer circuit after another quarter of a clock cycle. Hence, the provision of four synchronizer circuits achieves a substantial reduction in the latency of the synchronizing apparatus over the configuration with two synchronizer circuits.

According to embodiments, the decision mechanism circuit may comprise a first logic circuit, which receives each synchronized signal of each synchronizer circuit and outputs a first logic circuit signal. The first logic circuit changes the state of the first logic circuit signal to a high state when the state of one of the synchronized signals changes to a high state. The first logic circuit may thus comprise an OR logic gate. The decision mechanism circuit may further comprise a second logic circuit, which receives each synchronized signal of each synchronizer circuit and outputs a second logic circuit signal. The second logic circuit changes the state of the second logic circuit signal to a low state when the state of one of the synchronized signals changes to a low state. The first logic circuit may thus comprise an AND logic gate. Thus, for each change of state of the incoming signal, an associated logic circuit signal is provided which may then be propagated as the output signal of the synchronizing apparatus. A selector circuit may be provided, which generates the output signal based on the first logic circuit output signal, the second logic circuit output signal and the state of the memory element. Therein, the state of the memory element can be used to determine whether to select the first or the second logic circuit signal and propagate it as the output signal of the synchronizing apparatus.

Further, a third logic circuit may be provided which receives the synchronized signals of each synchronizer circuit and outputs a third logic circuit signal. The third logic circuit changes the state of the third logic circuit signal to a high state when the states of all synchronized signals change to a low state. The first logic circuit may thus comprise a NOR logic gate.

According to embodiments, the memory element may comprise a RS-flip-flop which receives the second logic circuit signal and the third logic circuit signal, and outputs a selection signal. The selector circuit may receive the first logic circuit signal, the second logic circuit signal and the selection signal. The selector circuit may select as the output signal of the synchronizing apparatus one of the first logic circuit signal or the second logic circuit signal based on the selection signal. Hence, the output signal of the synchronizing apparatus can be generated with a particularly small delay by a simple selection of one of two already generated signals, wherein the selection is controlled by the selection signal output from the memory element.

Further, a method for synchronizing an incoming signal with a clock signal is provided. The method may comprise receiving said incoming signal and said clock signal at two or more synchronizer circuits and generating a synchronized signal, wherein the state of each synchronized signal changes on a different point in time of said clock signal in response to a change of the state of said incoming signal.

Therein, a point in time of the clock signal may constitute a specific phase of the clock signal, such as e.g. an edge of the clock signal or any point defined e.g. by a predetermined delay after an edge of the clock signal. Thus, a change of the state of the incoming signal can be detected with low latency whenever the next synchronizer circuit becomes active during a cycle of the clock signal. Further, the method may comprise determining an output signal in response to said synchronized signals, the determination being performed according to a state of a memory element which is set according to a previously detected state of said incoming signal. The memory element allows a prediction of the type of state change (low to high or high to low) that is to be expected next, such that the output signal can be determined in a particularly efficient way for each type of state change.

According to embodiments, the method may further comprise determining a state of the memory element which corresponds to the opposite value of the state of the incoming signal. Thus, the memory element can indicate which state the incoming signal is expected to change to.

According to embodiments, a change of the state of the output signal is determined when the state of one of the synchronized signals changes in response to the change of the state of the incoming signal and when the changed state of one of the synchronized signals corresponds to the state of the memory element. Thus, a low latency between the incoming signal and the output signal of the synchronizing apparatus can be achieved.

According to embodiments, a change of the state of the output signal is determined when the state of all the synchronized signals changes to the same state in response to the change of the state of the incoming signal and when the changed states of the synchronized signals correspond to the state of the memory element. Thus, a particularly robust synchronizing method can be provided, wherein an error in a single synchronized signal is not passed out as the output signal of the synchronizing apparatus.

It should be noted that the above mentioned aspects for a synchronizing apparatus are applicable for the suggested method as well. Thus, all aspects disclosed for embodiments of the apparatus can be combined with the suggested method to achieve similar effects and advantages.

These and other aspects of the invention will be apparent from and elucidated with reference to the embodiments described hereinafter, by way of example, with reference to the drawings.

SHORT DESCRIPTION OF THE FIGURES

The invention is explained below in an exemplary manner with reference to the accompanying drawings, wherein FIG. 1 prior art illustrates a standard two stage synchronizer (prior art);

DETAILED DESCRIPTION

As indicated in the introductory section, the present document is directed to a low latency synchronizer circuit for synchronizing an incoming digital signal with an internal clock.

Figure 1:
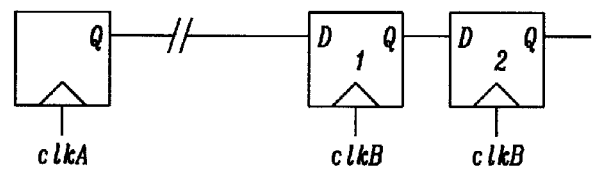

A two stage synchronizer, as shown in FIG. 1 prior art, comprises two flip-flops 1 and 2 connected in series and driven by a common clock signal clkB. The first flip-flop 1 samples the asynchronous received data signal which is generated with a clock signal clkA, wherein clkA is asynchronous with clkB. The second flip-flop 2 is used to block any meta-stable signal output by the first flip-flop 1 until a subsequent phase of clkB, e.g. until the next clock edge. Thus, the flip-flops 1, 2 together form a basic synchronizer circuit.

Figure 2:
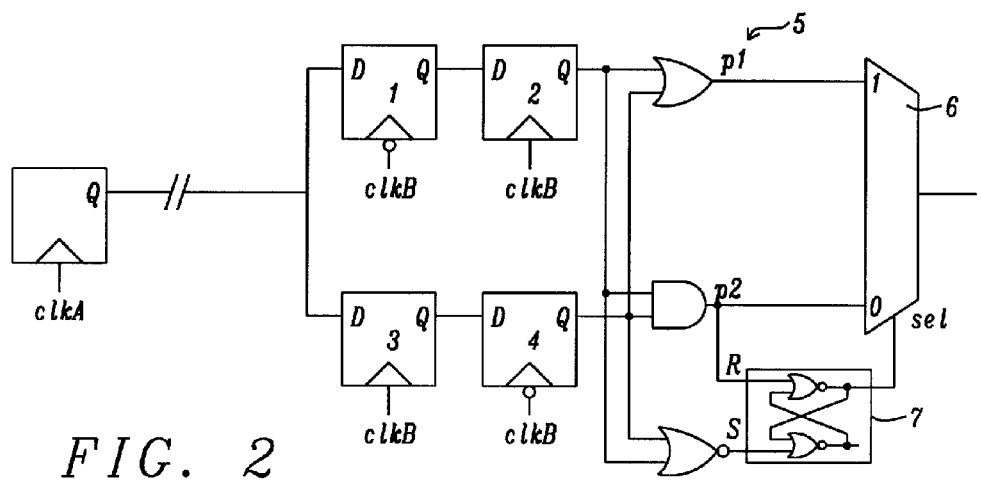
FIG. 2 depicts an example of a proposed low latency synchronization scheme.

FIG. 2 illustrates an example of a low latency synchronization circuit according to an embodiment of the present disclosure. The proposed synchronization scheme comprises two parallel synchronizer circuits, which work on different phases of a clock signal. In particular, each synchronizer circuit comprises two flip-flops in a two-stage configuration as outlined above in conjunction with FIG. 1, wherein the first two-stage configuration is formed by flip-flops 1 and 2 and the second two-stage configuration is formed by flip-flops 3 and 4. In this example, different phases of the receiving clock signal are used for sampling the incoming signal in parallel such that some phases will "capture" the incoming signal prior to others. Flip-flops 1 and 3 each sample the incoming signal. In the presently considered example, they are both in opposite clock phase to one another; therefore one of the two will sample a change of state of the incoming signal before the other. Flips-flops 2 and 4 are used to block the potential "metastable" condition of the respective flip-flops 1 and 3 (as in a standard synchronizer circuit with the two-stage configuration). In this example, the second flip-flops 2 and 4 are in opposite clock phases to each other and each of second flip-flops 2 and 4 is also in the opposite clock phase to its associated first flip-flop 1 and 3, respectively.

If e.g. flip-flops 1 and 3 are activated at rising and falling edges of the clock signal clkB, respectively, then flip-flops 1 and 2 function as a half-period two stage synchronizer for synchronizing to the rising flank of clock signal clkB, and flip-flops 3 and 4 function as another half period two stage synchronizer for synchronizing to the falling flank of clock signal clkB.

The proposed synchronization scheme further comprises a decision mechanism circuit 5 which receives the synchronized signals from each of the synchronizer circuits. The decision mechanism circuit 5 comprises an OR logic gate, an AND logic gate, a NOR logic gate and an RS latch 7. Each of the logic gates receives the synchronized signals of each of the synchronizer circuits. The output signal p1 of the OR logic gate is used to detect if one of the synchronized signals has changed to a logic "1" state. The output signal p2 of the AND logic gate is used to detect if one of synchronized signals has changed to a logic "0" state.

In the shown example, the signals p1 and p2 cannot change simultaneously since the flip flops 2 and 4 respectively change their outputs at different times, due to the different edge sensitivity of their clock pin (one is positive edge triggered the other negative edge triggered).

A selection mechanism 6 e.g. a multiplexer MUX is provided, which propagates either signal p1 or p2 as a synchronized signal. The decision whether to propagate signal p1 or p2 may be dependent on the history: If the incoming signal was at steady state 0, then the outputs of flip-flops 2 and 4 will initially also be steady at 0. If the incoming signal then changes to 1, this change should be detected and output as quickly as possible in order to provide a synchronized signal with low latency. In order to detect a change of the incoming signal to state 1, the change of either of the output signals of flip-flops 2 or 4 to a state 1 may be detected as quickly as possible. This may be accomplished by observing or propagating signal p1 as it changes to state 1 as soon as only one of the two signals of flip-flops 2 or 4 changes to 1, regardless which.

The same way, if the incoming signal was steady at the logic state 1, then the synchronized signals of flip-flops 2 and 4 will initially also be steady at 1. In this case, a change of either of the output signal of flip-flops 2 or 4 to state 0 may be detected as quickly as possible. This may be accomplished by 'observing' or propagating signal p2 as it changes to state 0 as soon as only one of the two output signals of flip-flops 2 or 4 changes to 0, regardless which.

In the embodiment shown in FIG. 2, there is thus provided a memory element 7 which stores the state that is expected to be encountered depending on the state that was previously detected.

The memory element 7 may comprise e.g. a RS latch circuit 7. The RS latch 7 receives the output of the NOR logic gate connected to the synchronized signals of flip-flops 2 and 4 as a set input signal, and the output p2 of the AND logic gate as a reset input signal. Thus, whenever the synchronized signals of flip-flops 2 and 4 are both at 0, the RS latch 7 is set to a state, wherein, as described above, a change of the incoming signal from a state 0 to a state 1 is expected, such that the selection mechanism 6 selects signal p1 which indicates that one of the flip-flops 1 and 3 has detected a rise in the incoming signal. With the synchronized signals of flip-flops 2 and 4 both at 0, the NOR logic gate will output a signal 1, which is then input into the memory element 7 to set its state to 1. Whenever the incoming signal is at steady state at level 1, the memory element 7 is reset via the AND logic gate such that any fall in the incoming signal to level 0 is going to be detected by signal p2, which is then going to be propagated by the selection mechanism 6.

The selection mechanism 6 thus selects one of the signals p1, p2 of the OR logic gate or the AND logic gate, based on a selection signal sel which is the output of the memory element 7.

Figure 3:
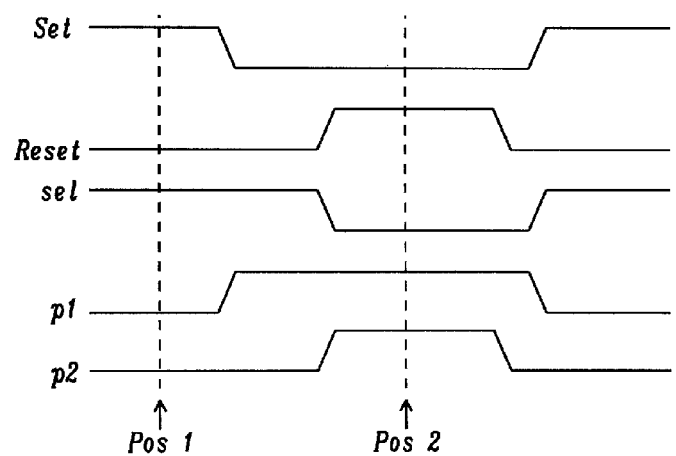
FIG. 3 depicts a low latency synchronizer timing diagram for the example shown in FIG. 2.

FIG. 3 shows a timing diagram which illustrates the setting and resetting of the RS latch circuit 7. At position Pos1 as shown in FIG. 3, both signals p1 and p2 are at a logical 0 state, which means that the incoming signal is at a logical 0 state. Then, the memory element 7 is in a "set" state such that the selection circuit 6 is to select the signal p1 as the output signal of the synchronizing apparatus so that a rising edge of the incoming signal can be detected as quickly as possible, i.e. when the first synchronizer circuit registers a change to a logical state 1. After both synchronizer circuits have registered the change of state of the incoming signal to the logical state 1, i.e. when both signals p1 and p2 have changed to the logical state 1, the memory element 7 is set into a "reset" state, wherein the selection circuit 6 is to select the signal p2 as the output signal of the synchronizing apparatus. Thus, at position Pos2, the first occurrence of the state of the incoming signal changing back to a logical value 0 can be detected, as the memory element 7 is set to expect a falling edge of the incoming signal.

Figure 4:
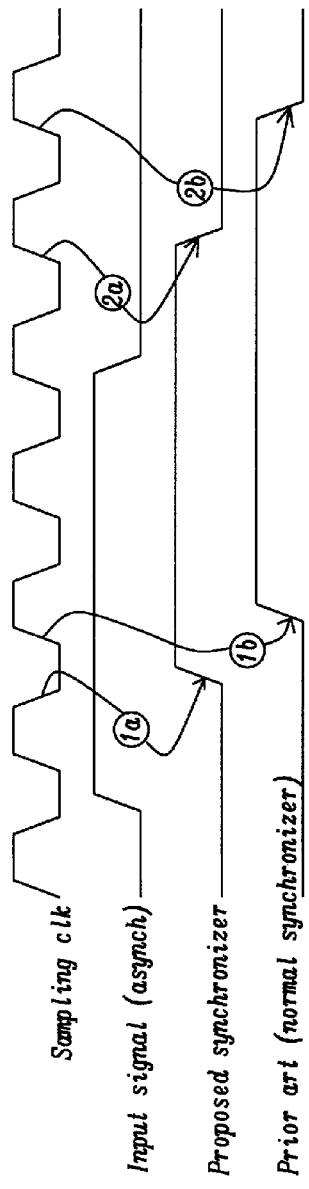
FIG. 4 illustrates the performance of the low latency synchronizer shown in FIG. 2 compared to a prior art synchronizer as shown in FIG. 1.

FIG. 4 shows a timing diagram of typical situations during the operation of an apparatus according to an embodiment.

In the left portion of FIG. 4 is shown "Case 1", where the asynchronous input to the synchronizer changes just after the falling edge of the sampling clock clkB. Therein, the change of state of the incoming signal will be detected by flip-flop 1 (see FIG. 2) during the next rising edge of the sampling clock clkB and will be passed on by flip-flop 2 during the subsequent falling edge of the sampling clock clkB, see marker "1a" in FIG. 4. As described above, the memory element 7 will be set such that this first detection of the state change of the incoming signal to a logical 1 will be immediately output, as the selection circuit 6 will select the output p1 of the OR-gate as the signal to propagate.

In contrast to this, a prior art synchronizer circuit will have flip-flops which only detect the rising edge of the sampling clock clkB, such that a whole clock cycle will pass between detection of the change of state of the incoming signal and the output of the change of state in the synchronized signal, see marker "1b". Thus, the output of the synchronizing apparatus according to the present embodiment will react faster. This case results in a gain of latency of ½ a clock period.

In the right portion of FIG. 4 is shown "Case 2", where the asynchronous input to the synchronizer changes just after the rising edge of the clock. The change of state of the incoming signal will be detected by flip-flop 3 (see FIG. 2) during the next falling edge of the sampling clock clkB and will be passed on by flip-flop 4 during the subsequent rising edge of the sampling clock clkB, see marker "2a" in FIG. 4. The prior art synchronizer circuit will detect the change of state of the incoming signal with the first flip-flop at the next rising edge of the sampling clock, and will then take a further clock period to pass this signal through the second flip-flop, see marker "2b" in FIG. 4. Thus, the synchronizing apparatus according to the present embodiment can even gain one complete clock period in latency when compared to a prior art synchronizer circuit as shown in FIG. 1.

Figure 5:
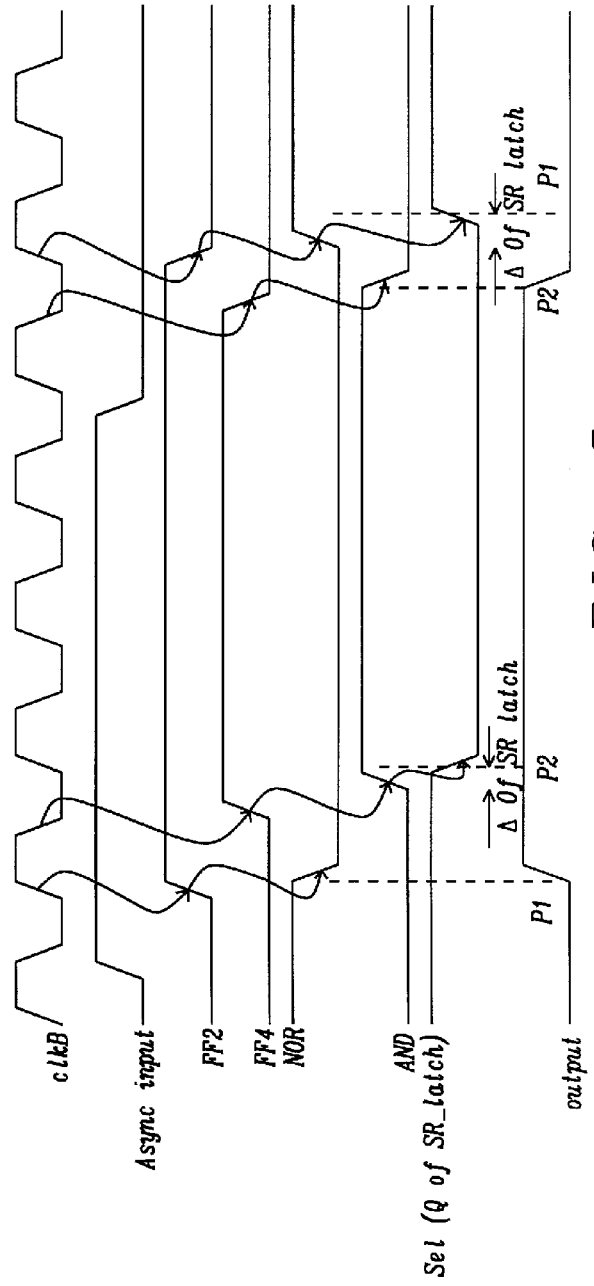
FIG. 5 is a timing diagram that illustrates the stability of the low latency synchronizer shown in FIG. 2.

FIG. 5 illustrates that, for the embodiment shown in FIG. 2, the output signal is stable even if the logic circuit signals of the OR and AND logic gates are changing close to or at the same time as the select signal for the multiplexer MUX. The timing diagram below shows the different stages of signals changing their states and the cause-effect for each of the signals.

The outputs of the OR/NOR gates and that of the AND gate are stable before the select signal for the multiplexer can change, as the signals of the NOR and the AND gates are the ones responsible for changing the state of the RS latch 7. Thus, the select signal, which is output by the RS latch 7 after the signals of the NOR and AND gates have been changed, is always later in time.

As shown in FIG. 5, when the asynchronous incoming signal changes from state 0 to state 1, this change is picked up first by the synchronizer circuit comprising flip-flops 1 and 2, and flip-flop 2 will change the state of its synchronized signal two half-periods of the sampling clock later. With the change of the synchronized signal of flip-flop 2, the signal of the OR logic gate changes to 1 (and the signal of the NOR logic gate changes to 0). As sel is set to 1 at this point, signal p1 (see FIG. 2) of the OR logic gate is propagated as an output signal and the output of the synchronizing apparatus changes to state 1. When the synchronizer circuit comprising flip-flops 3 and 4 also detects the change of state of the incoming signal, the AND logic gate will change its signal p2 to 1. This causes the RS latch 7 to be reset (see FIG. 2), such that the selection signal sel of the RS latch changes to 0 and p2 is propagated as an output of the synchronizing apparatus. However, after the AND logic gate has changed its state to 1, p2 and p1 are identical so that the change in the state of the selection signal sel does not affect the output of the synchronizing apparatus.

As shown in the right part of FIG. 5, the same happens in the opposite case of the incoming signal changing its state from 1 to 0. Then, one of the synchronizer circuits, in this case flip-flops 3 and 4, detects the change of state first and causes the AND logic gate to change its signal p2 to state 0. As sel is at 0, p2 will be propagated as the output of the synchronizing apparatus. When the other synchronizer circuit, in this case flip-flops 1 and 2, has also detected the change of state of the incoming signal to 0, signal p1 of the OR logic gate will change to 0 and the signal of the NOR logic gate will change to 1, thus setting the RS latch 7 and changing the selection signal sel to 1. However, the change of the selection signal does not change the output of the synchronizing apparatus, as both signals p1 and p2 are at state 0 at that point in time.

In order to further ensure the stable behavior of the synchronizing apparatus, a small systematic delay can be added on the output of the RS latch 7.

To summarize, a normal synchronizer (prior art) is sampling two consecutive times with the rising edge of the clock, thus its latency is between one clock cycle (when the input changes just before the rising edge of the clock) to two clock cycles (when the input changes just after the rising edge of the clock). The low latency synchronizer according to the present embodiment has a latency of ½ a clock period (when the signal changes just before an edge—rising or falling) to one clock period (when the input changes just after an edge—rising or falling)

The reason for the difference in latency or speed of processing is that the prior art samples always on the rising edge while the low latency synchronizes according to the present embodiment samples on both edges, and has a built in circuitry to determine which internal signal (p1 or p2) needs to be propagated to the output.

Figure 6:
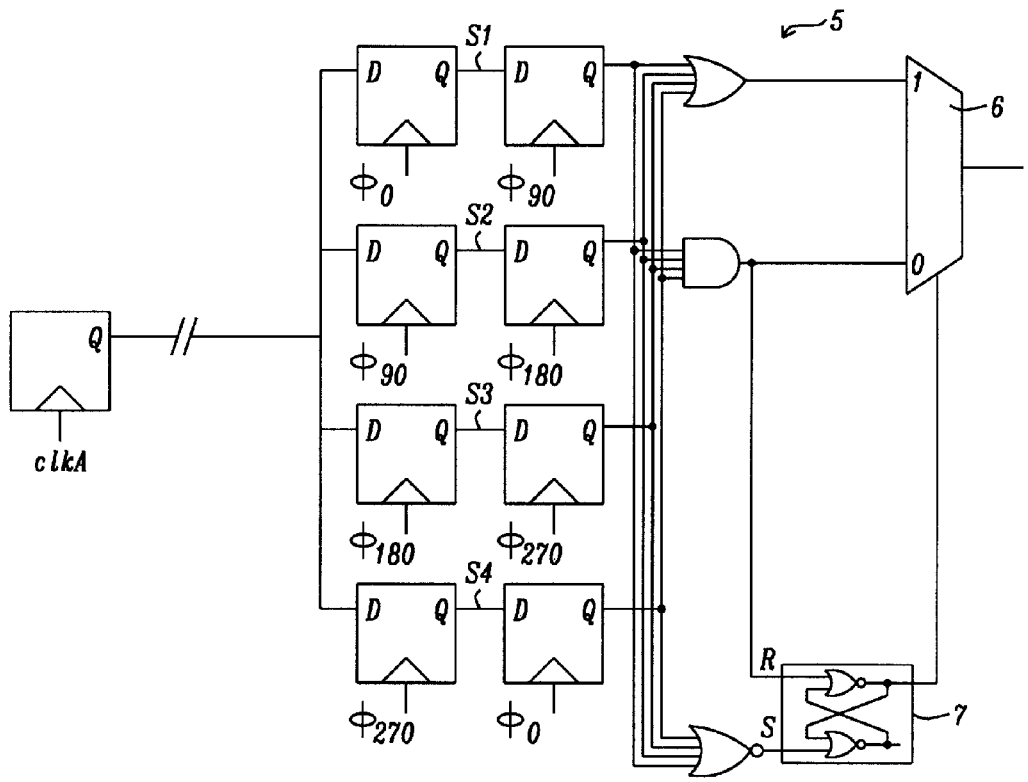
FIG. 6 depicts an example of an extension of the low latency synchronization scheme to multiple phases.

It is possible to generalize the concept described above in conjunction with FIGS. 2 to 5 when multiple phases of the sampling clock signal clkB are available. This may occur especially in a system which contains delay locked loops or phase locked loops. FIG. 6 depicts a case where 4 phases of the clock are available.

The circuit is made of 4 parallel synchronizer circuits S1-S4 each connected as shown. Therein, each synchronizer circuit S1-S4 is configured as a two-stage flip-flop as described in conjunction with FIGS. 1 and 2. The respective clock phase differences between synchronizer circuits are 90°, and the respective second flip-flop is also phase-shifted by 90° relative to its first flip-flop. Having the second flip-flop activate at the subsequent clock phase to the associated first flip-flop achieves a particularly fast response time. It is, however, also possible to choose a larger phase difference between the first and the second flip-flops of the same synchronizer circuit.

In the example shown in FIG. 6, the first synchronizer circuit S1 comprises two flip-flops which are set at phases of 0 and 90 degrees, respectively, the second synchronizer circuit S2 comprises two flip-flops which are set at phases of 90 and 180 degrees, respectively, the third synchronizer circuit S3 comprises two flip-flops which are set at phases of 180 and 270 degrees, respectively, and the fourth synchronizer circuit S4 comprises two flip-flops which are set at phases of 270 and 0 degrees, respectively.

The embodiment shown in FIG. 6 comprises a detection mechanism circuit 5, a memory element 7 and a selection circuit 6 which operate along the same principle as described above in conjunction with FIG. 2. Thus, if a logic state 1 is expected to arrive at the incoming signal while the incoming signal is at a steady state level of 0, the output of the OR gate is propagated through the selection circuit 6. This means that any single synchronizer output changing with any of the phases will trigger the output of the OR gate to change from 0 to 1.

If a logic state 0 is expected to arrive at the incoming signal while the incoming signal is at a steady state level of 1, the output of the AND gate is propagated through the selection circuit 6. This means that any single synchronizer output changing with any of the phases will cause the AND output to change to a logic 0. Thus, the latency of the embodiment shown in FIG. 6 is particularly low, as any change in the incoming signal will be detected and output promptly. The embodiment of FIG. 6 comprises a memory element 7 which functions in a similar way as the memory element described in conjunction with FIG. 2. Thus, the memory element is set by the NOR logic gate if the previously detected state of the incoming signal is 0 and reset by the AND logic gate if the previously detected state of the incoming signal is 1. The memory element 7 outputs a selection signal to the multiplexer MUX, as described above in conjunction with FIG. 2.

Figure 7:
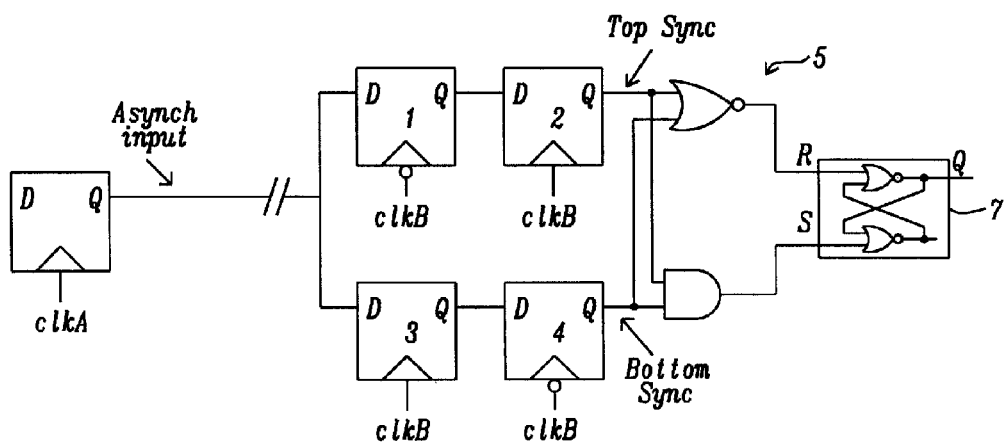
FIG. 7 depicts an example of a low latency synchronizer circuit which is configured as a hardened synchronizer.

A further embodiment is shown in FIG. 7, which depicts a synchronizer circuit that is particularly useful if safe communication between two digital clock domains is necessary (especially in the areas of automotive, medical applications or space applications).

Therein, two synchronizer circuits are provided which are substantially identical to the synchronizer circuits shown in FIG. 2, i.e. a top synchronizer circuit comprises two flip-flops 1 and 2, which are set at opposite phases of the sampling clock, and a bottom synchronizer circuit comprises flip-flops 3 and 4, which are also set at opposite phases of the sampling clock. The respective first flip-flops 1, 3 of the top and bottom synchronizer circuits are further set at opposite clock phases to each other.

In the embodiment of FIG. 7, the detection mechanism circuit 5 does not comprise the selection circuit 6 as shown in FIG. 2. Instead, the embodiment of FIG. 7 employs the fact that the NOR gate and the AND gate both are guaranteed to change their outputs at different times. The memory element 7 is used for selecting the output signal.

Figure 8:
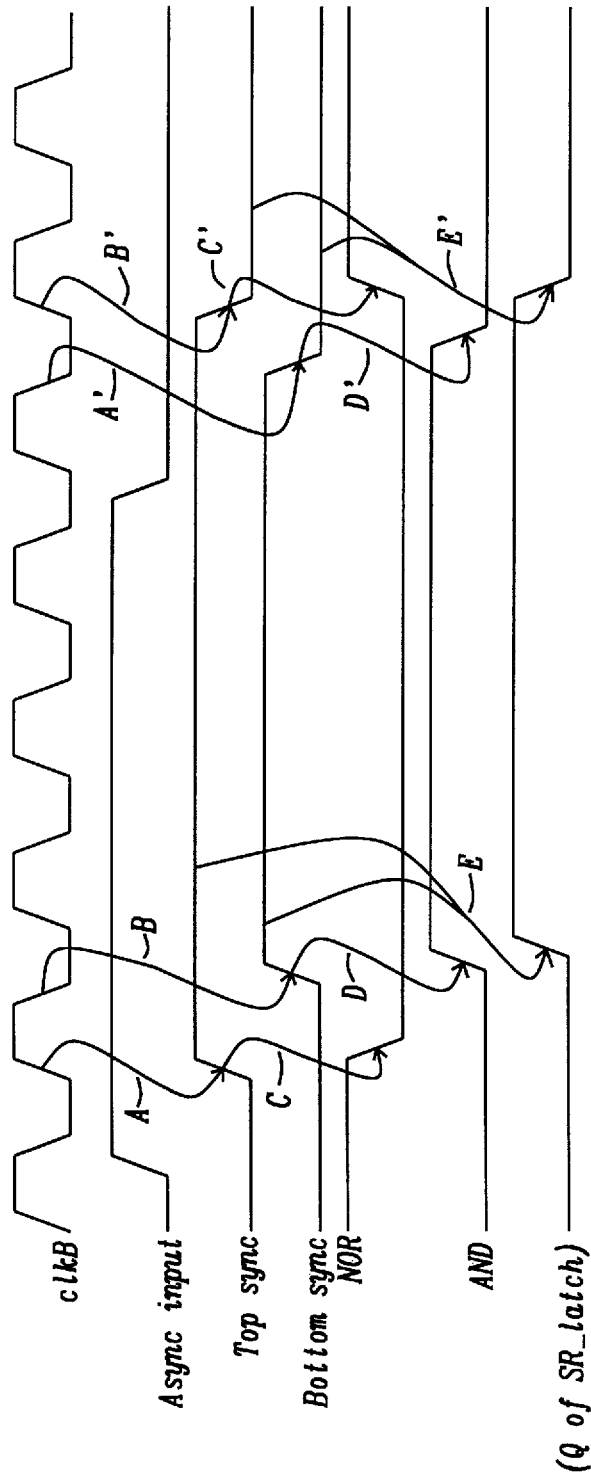
FIG. 8 shows a timing diagram of the hardened synchronizer of FIG. 7.

FIG. 8 shows an associated timing diagram for the embodiment of FIG. 7. The output of the NOR gate is connected to the reset pin of the RS latch 7. Whenever the NOR gate outputs a logic state 1, a logic state 0 will be seen at the output of the RS latch 7. The output of the NOR gate is 1 when both of its inputs are 0. This in turn forces a logic state 0 at the output of the entire circuit. When one of the signals changes to logic 1, the RS latch 7 keeps its state as both of the inputs to RS latch 7 are 0. Only after the AND gate goes high (as a result of both flip-flop 2 and flip-flop 4 being logic state 1) the RS latch 7 will be "set" and changes its output to 1. This is marked with arrows in the timing diagram of FIG. 8. Therein, arrow A marks the detection of the top synchronizer circuit comprising flip-flops 1 and 2 of the rising flank of the incoming asynchronous input signal at the rising flank of the sampling clock clkB. The bottom synchronizer circuit comprising flip-flops 3 and 4 detects the rising flank of the incoming asynchronous input signal half a clock cycle later at the falling flank of the sampling clock clkB, as shown by arrow B. The change of the synchronized output of the first synchronizer circuit causes the output of the NOR gate to change to 0, as shown by arrow C. The change of the synchronized output of the second synchronizer circuit causes the output of the AND gate to change to 1, as shown by arrow D. Finally, the output of the RS latch circuit 7 is changed 1 with the change in output of the AND gate, as shown by arrow E.

The same procedure acts in reverse for moving from an output of 1 to an output of 0. At arrow A', the bottom synchronizer circuit detects the change of state of the incoming signal to 0. This causes the AND logic gate to change its output to 0, as shown by arrow D'. Half a clock cycle later, the top synchronizer circuit changes detects the change of state of the incoming signal and causes the NOR gate to change its output to 1, as both its input are state 0. The signal of the NOR gate resets the RS latch 7 to state 0, so that the output of the synchronizing apparatus changes to 0 as soon as all synchronizer circuits have registered the change of the state of the incoming signal to 0.

The inherent difference between the embodiment depicted in FIG. 2 (low latency synchronizer) and that of FIG. 7 (robust low latency synchronizer) is that the circuit of FIG. 2 reacts on a change of the first output change of either flop 2 or 4, while the circuit of FIG. 7 reacts when only both have reached the same state.

The robust synchronizer has always a maximum latency of 1.5 clock cycles. While the prior art solution has a maximum latency of the number of stages introduced (number of flip-flops) times the clock period.

Notice that although the latency introduced in the FIG. 7 circuit (hardened synchronizer) is higher than that of the one in FIG. 2, it is still better than a standard solution which may use three flip-flops in series in order to guard against metastable states and which has a maximum latency of 3 clock cycles.

Moreover, the robust synchronizer is still better than even the standard minimal 2 stage synchronizer used extensively (FIG. 1), since the standard two stage synchronizer has a maximum latency of 2 clock cycles.

Figure 9:
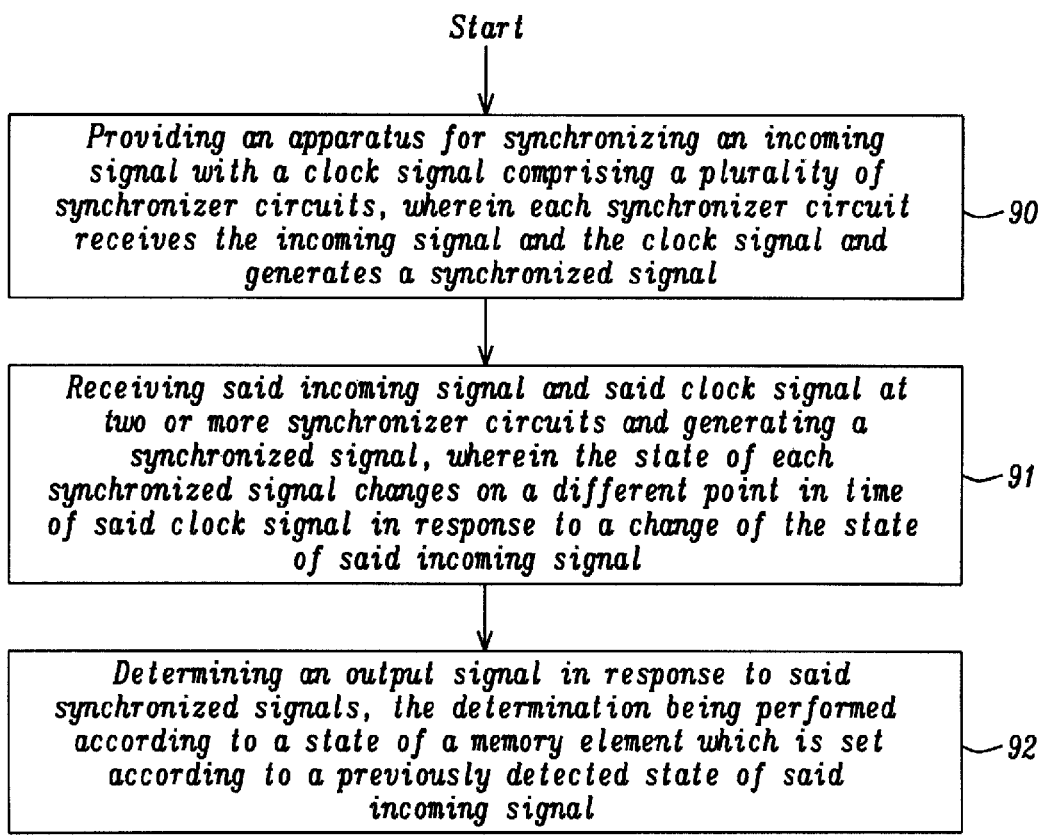
FIG. 9 illustrates a flowchart of a method to achieve stabile, low latency synchronization of asynchronous signals with a clock signal.

FIG. 9 illustrates a flowchart of a method to achieve stabile, low latency synchronization of asynchronous signals with a clock signal. A first step 90 describes the provision. A first step 50 describes the provision of a synchronizing apparatus comprising a plurality of synchronizer circuits, wherein each synchronizer circuit receives the incoming signal and the clock signal and generates a synchronized signal. Step 91 illustrates receiving said incoming signal and said clock signal at two or more synchronizer circuits and generating a synchronized signal, wherein the state of each synchronized signal changes on a different point in time of said clock signal in response to a change of the state of said incoming signal. Step 92 discloses determining an output signal in response to said synchronized signals, the determination being performed according to a state of a memory element which is set according to a previously detected state of said incoming signal.

The present description is not limited to embodiments wherein each synchronizer circuit is associated with a phase of the sampling clock that differs from the associated phases of all other synchronizer circuits. For added robustness, some synchronizer circuits may be associated with the same clock phases. Multiple groups of synchronizer circuits may thus be provided, wherein each group comprises synchronizer circuits associated with the same clock phase, but different groups are respectively associated with different, e.g. opposite, clock phases.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Furthermore, it should be noted that steps of various above-described methods and components of described systems can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

In addition, it should be noted that the functions of the various elements described in the present patent document may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

Finally, it should be noted that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The invention claimed is:

1. An apparatus for synchronizing an incoming signal with a clock signal, said apparatus comprising:
   two or more synchronizer circuits, wherein each synchronizer circuit receives said incoming signal and said clock signal, wherein each synchronizer circuit generates a synchronized signal, wherein a state of each synchronized signal respectively changes on a different point in time of said clock signal in response to a change of a state of said incoming signal, wherein each synchronizer comprises;
      a first flip-flop which receives said clock signal and said incoming signal, wherein said first flip-flop generates a first latched signal, wherein a state of said first latched signal changes on a predetermined first phase of said clock signal in response to said change of the state of said incoming signal; and
      a second flip-flop which receives said clock signal and said first latched signal of the first flip-flop, wherein said second flip-flop generates the synchronized signal of the synchronizer circuit, wherein the state of said synchronized signal changes on a predetermined second phase of said clock signal in response to a change of the state of said first latched signal, wherein said predetermined first phase of one synchronizer circuit differs from a predetermined first phase of another synchronizer circuit, and wherein said predetermined second phase of each synchronizer circuit differs from a predetermined second phase of another synchronizer circuit; and
   a decision mechanism circuit which receives said two or more synchronized signals generated by the synchronizer circuits, and determines an output signal in response to said two or more synchronized signals generated by the synchronized circuits; the decision mechanism circuit further comprising a memory element which comprises a RS-flip-flop having a state which is set according to a previously detected state of said incoming signal, wherein said output signal is determined according to a state of the memory element.

2. The apparatus according to claim 1, wherein said decision mechanism circuit determines a change of a state of said output signal when the state of one of the received synchronized signals changes in response to said change of the state of said incoming signal and when the changed state of one of the received synchronized signals corresponds to the state of the memory element.

3. The apparatus according to claim 1, wherein said decision mechanism circuit determines a change of a state of said output signal when the state of all the received synchronized signals changes to a same state in response to said change of the state of said incoming signal and when the changed states of the received synchronized signals correspond to the state of the memory element.

4. The apparatus according to claim 1, wherein said clock signal comprises multiple phases, wherein a plurality of synchronizer circuits are provided, and wherein each synchronizer circuit is associated with a dedicated phase of the clock signal such that the state of its synchronized signal changes on the associated phase of said clock signal in response to a change of the state of said incoming signal.

5. The apparatus according to claim 1, wherein said first and said second phases of said clock signal are subsequent phases of the clock signal, in particular a rising edge and a falling edge of the clock signal or a falling edge and a rising edge of the clock signal.

6. The apparatus according to claim 1, wherein two synchronizer circuits are provided, wherein said first and said second phases of said clock signal for each synchronizer circuit have a phase difference of 180 degrees relative to each other, and wherein the first flip-flop of the first synchronizer circuit and the second flip-flop of the second synchronizer circuit are respectively associated with identical clock phases.

7. The apparatus according to claim 1, wherein four synchronizer circuits are provided, and wherein said first and said second phases of said clock signal for each synchronizer circuit have a phase difference of 90 degrees relative to each other, and wherein the clock phase associated with the first flip-flop of one synchronizer circuit has a phase difference of 90 degrees to the clock phase associated with the first flip-flop of another synchronizer circuit.

8. The apparatus according to claim 1, wherein said decision mechanism circuit comprises:
   a first logic circuit which receives each synchronized signal of each synchronizer circuit and outputs a first logic circuit signal, wherein said first logic circuit changes a state of said first logic circuit signal to a high state when the state of one of said synchronized signals changes to a high state;
   a second logic circuit which receives each synchronized signal of each synchronizer circuit and outputs a second logic circuit signal, wherein said second logic circuit changes a state of said second logic circuit signal to a low state when the state of one of said synchronized signals changes to a low state; and
   a selector circuit, which generates said output signal based on said first logic circuit signal, said second logic circuit signal and said state of the memory element.

9. The apparatus according to claim 8, further comprising a third logic circuit which receives the synchronized signals of each synchronizer circuit and outputs a third logic circuit signal, wherein said third logic circuit changes a state of said third logic circuit signal to a high state when the states of all synchronized signals change to a low state.

10. The apparatus according to claim 9, wherein said memory element comprises the RS-flip-flop which receives said second logic circuit signal and said third logic circuit signal, and outputs a selection signal; and
   wherein said selector circuit receives said first logic circuit signal, said second logic circuit signal and said selection signal, wherein said selector circuit selects as said output signal of the synchronizing apparatus one of said first logic circuit signal or said second logic circuit signal based on said selection signal.

11. A method for synchronizing an incoming signal with a clock signal, said method comprising:
   receiving said incoming signal and said clock signal at two or more synchronizer circuits, wherein each synchronizer circuit comprises a first flip-flop and a second flip-flop signal; and
   generating, by each synchronizer circuit, a synchronized signal, wherein a state of each synchronized signal respectively changes an a different phase of said clock signal in response to a change of a state of said incoming signal; and
   determining an output signal in response to said two or more synchronized signals generated by the synchronizer circuits, the determination being performed according to a state of a memory element comprising a RS-flip-flop, wherein said state of said memory element is set according to a previously detected state of said incoming signal,
wherein said first flip-flop of each synchronizer circuit generates a first latched signal, wherein a state of said first latched signal changes on a predetermined first phase of said clock signal in response to said change of the state of said incoming signal;
wherein said second flip-flop of each synchronizer circuit receives said clock signal and said first latched signal of the first flip-flop of the respective synchronizer circuit and generates the synchronized signal of the respective synchronizer circuit, wherein the state of said synchronized signal changes on a predetermined second phase of said clock signal in response to a change of the state of said first latched signal, wherein said predetermined first phase of each synchronizer circuit differs from a predetermined first phase of another synchronizer circuit, and wherein said predetermined second phase of each synchronizer circuit differs from a predetermined second phase of another synchronizer circuit.

12. The method of claim 11, further comprising determining the state of the memory element which corresponds to an opposite value of the state of the incoming signal.

13. The method of claim 11, wherein a change of a state of said output signal is determined when the state of one of the synchronized signals changes in response to said change of the state of said incoming signal and when the changed state of one of the synchronized signals corresponds to the state of the memory element.

14. The method of claim 11, wherein a change of a state of said output signal is determined when the state of all the synchronized signals changes to a same state in response to said change of the state of said incoming signal and when the changed states of the synchronized signals correspond to the state of the memory element.

15. The method of claim 11, further comprising providing at least one synchronizer circuit that is ready to record the change of state in the incoming signal within a fraction of a clock cycle by defining a point of time of the clock signal by a predetermined delay after an edge of the clock signal.

16. The method of claim 11, further comprising using a first synchronized signal which registers the change of state of the incoming signal is used for changing a state of the output signal in order to achieve a fast detection of the change of state of the output signal of the synchronizing apparatus.

17. The method of claim 11, further comprising reducing latency time between the change of state of the incoming signal and the corresponding change of state of the output synchronized signal by associating each synchronizer circuit with a dedicated phase of the clock signal such that the state of its synchronized signal changes on the associated phase of the clock signal in response to the change of the state of the incoming signal.

18. The method of claim 11, wherein each synchronizer circuit may be activated during a different phase of the clock signal, such that the change of state of the input signal will be detected quickly by at least one synchronizer circuit with an associated first clock phase that occurs just after the change of state of the input signal.

19. The method of claim 11, wherein two synchronizer circuits are provided, wherein a first and a second phase of the clock signal for each synchronizer circuit has a phase difference of 180 degrees relative to each other wherein the first flip-flop of a first synchronizer circuit is activated during a rising flank of the clock signal and the first flip-flop of a second synchronizer circuit is activated during a falling flank of the clock signal wherein the change of state of the incoming signal is thus detected within a maximum of half a clock cycle by either the first or the second synchronizer circuit, and is output by the synchronizer circuit after another half clock cycle.

20. The method of claim 11, wherein four synchronizer circuits are provided, wherein a first and a second phase of the clock signal for each synchronizer circuit has a phase difference of 90 degrees relative to each other wherein a clock phase associated with the first flip-flop of one synchronizer circuit has a phase difference of 90 degrees to a clock phase associated with the first flip-flop of another synchronizer circuit, wherein the change of state of the incoming signal is thus detected within a maximum of a quarter clock cycle by one of the synchronizer circuits, and is output by the synchronizer circuit after another quarter of a clock cycle.

\* \* \* \* \*